United States Patent [19]

Lebby et al.

[11] Patent Number: 5,818,404
[45] Date of Patent: Oct. 6, 1998

[54] INTEGRATED ELECTRO-OPTICAL PACKAGE

[75] Inventors: Michael S. Lebby, Apache Junction; John W. Stafford, Phoenix; Fred V. Richard, Scottsdale, all of Ariz.

[73] Assignee: Motorola, Inc., Schaumburg, Ill.

[21] Appl. No.: 610,532

[22] Filed: Mar. 4, 1996

[51] Int. Cl.$^6$ ........................................... G09G 3/32
[52] U.S. Cl. .......................... 345/82; 345/205; 257/81
[58] Field of Search ........................... 345/82, 205, 206; 257/81, 88, 98, 99; 361/806, 808, 820

[56] References Cited

U.S. PATENT DOCUMENTS

| | | | |
|---|---|---|---|
| 5,432,358 | 7/1995 | Nelson et al. | 257/81 |
| 5,699,073 | 12/1997 | Lebby et al. | 345/82 |
| 5,739,800 | 4/1998 | Lebby et al. | 345/82 |

*Primary Examiner*—Regina Liang
*Attorney, Agent, or Firm*—Eugene A. Parsons

[57] ABSTRACT

An integrated electro-optical package (50) including an optically transparent substrate (10) with an array (15) of light emitting devices (LEDs) (12) thereon, cooperating to generate a complete image, thereby forming a LED display chip (14). The LEDs (12) are positioned in rows and columns and having electrical connections adjacent outer edges of the substrate (10). A molded base (30), having embedded electrical conductors (31) for cooperating with the LEDs (12) of the LED display chip (14) and further having a refractive or diffractive lens (60) formed within a central opening (35), in alignment with the array (15) of LEDs (12) of the LED display chip (14) and on a side opposite the mounting of the LED display chip (14), thereby capable of magnifying the image and producing an easily viewable virtual image. A driver substrate (55) having electrical connections for interfacing with the molded base (30). A plurality of driver circuits (57) connected to the molded base (30) and LEDs (12) through electrodes on the driver substrate (55).

38 Claims, 8 Drawing Sheets

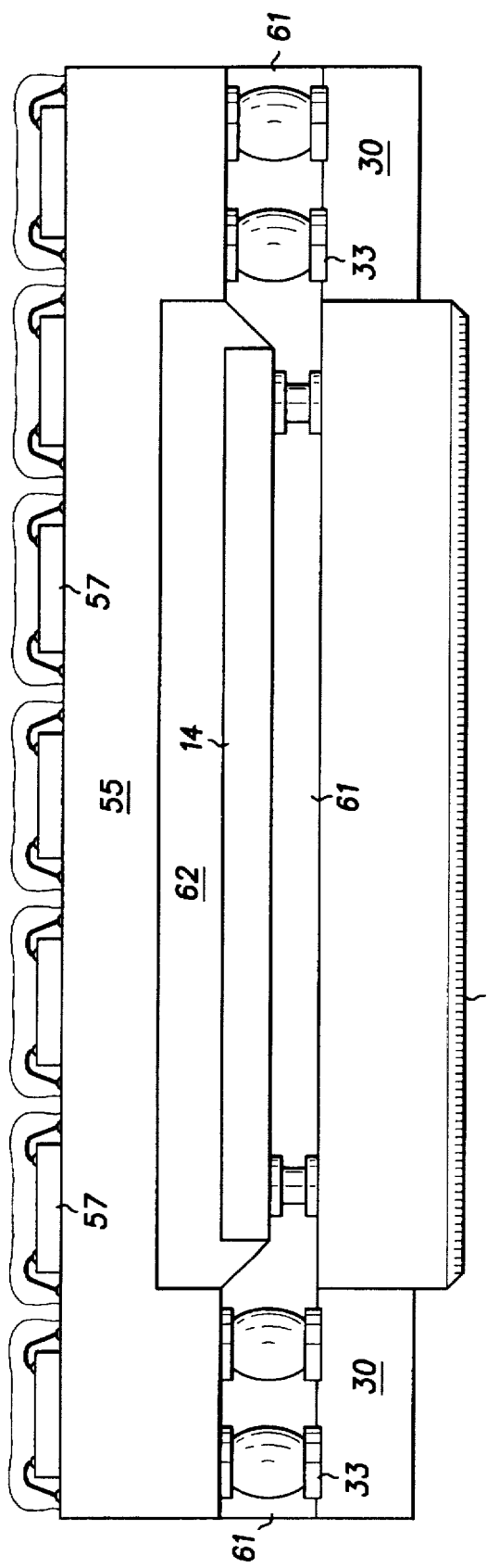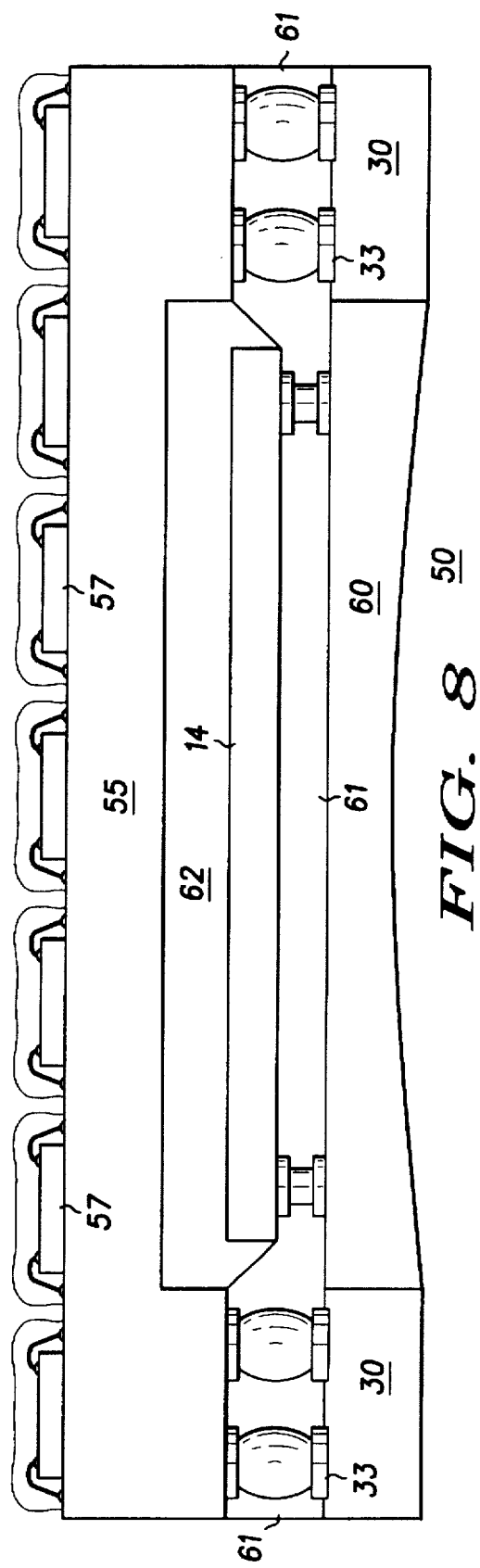

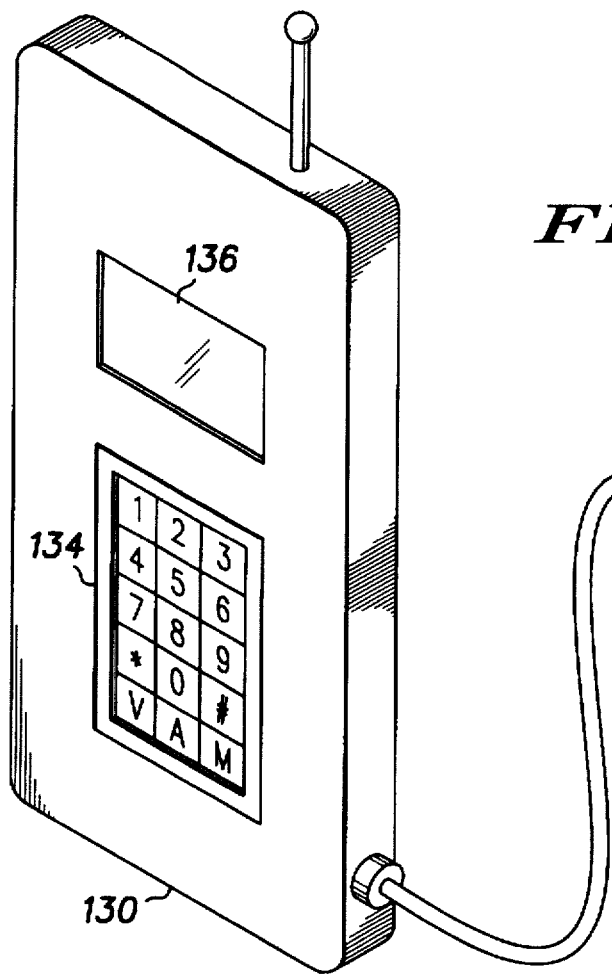
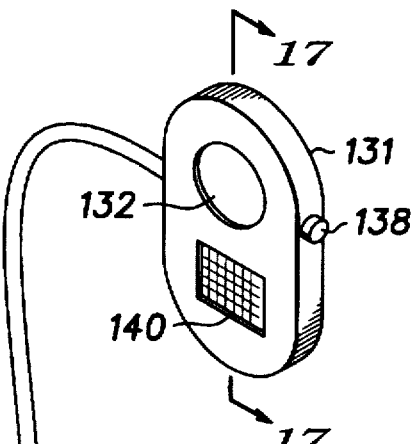
FIG. 16
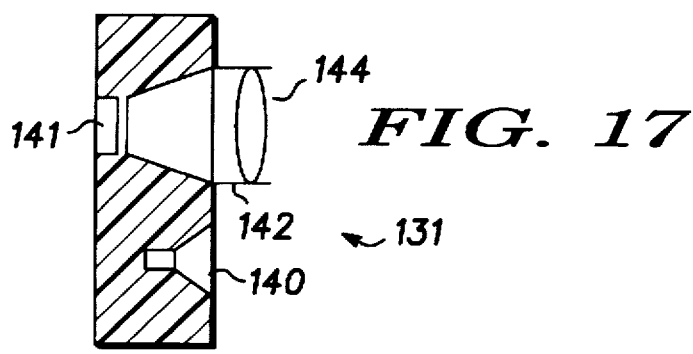
FIG. 17

INTEGRATED ELECTRO-OPTICAL PACKAGE

FIELD OF THE INVENTION

The present invention pertains to packages containing electrical and optical components connected in cooperation and more specifically to a package for electrically connecting optical components and driver circuits in electrical circuitry.

BACKGROUND OF THE INVENTION

Through the use of digital signals that are being transmitted at ever increasing frequencies, it is possible to transmit increasingly larger and more complex messages to remote portable units. Portable communications transceivers and other portable electronic equipment, such as cellular and cordless telephones, pagers, data banks, and the like, are becoming increasingly popular. In some instances it is possible to send complete messages, including alpha-numerics and/or graphics by way of novel pagers. Thus, complete messages can be sent to specific recipients.

In many instances it is desirable to provide a visual display on the communication transceiver to supply the operator with an indication of messages received, numbers actually dialed, and other minor but critical information. The problem is that the visual displays on prior art communications receivers are extremely limited in size and require relatively high electrical power as well as a great amount of area to be sufficiently large to produce a useful display. Thus, while the present visual displays are generally sufficient for displaying the minor information, they are not capable of displaying large alpha-numeric and/or graphic messages.

In the prior art, for example, it is common to provide visual displays utilizing liquid crystal displays, directly viewed light emitting devices, etc. These produce very large and cumbersome displays that greatly increase the size of the transceiver and require relatively large amounts of power. Further, such displays, when used on pagers, greatly limit the amount and, in many instances, the type of messages that can be received.

One way to alleviate package size problems in electro-optical packaging utilizing LED displays is to simplify the package and assembly to include molded monolithic components. This is achieved by integrating a molded plastic base with optical elements, and further having formed therein electrical interconnects, connection/mounting pads, embedded leadframes, and/or plated through-hole vias. The resulting package can then be directly mounted to a printed circuit board so that electronic signals can be interfaced. If required, additional optical components of the electro-optical package can be designed to be connected to the molded plastic optical base, so that assembly is quick and simple.

Generally, a semiconductor substrate, or integrated circuit, is mounted on a printed circuit board or the like and the accepted method for connecting the substrate to external circuits is to use standard wire bond technology. However, when a semiconductor substrate having a relatively large array of electrical components or devices formed thereon is to be connected, standard wire bond techniques can become very difficult. For example, if a relatively large array (greater than, for example, 10,000 or 100×100) of light emitting devices is formed on a substrate with a pitch (center-to-center separation) of P, then bond pads on the perimeter of the substrate will have a 2P pitch. This is true because every other row and every other column goes to an opposite edge of the perimeter to increase the distance between bond pads as much as possible.

At the present time wire bond interconnects from bond pads having a pitch of 4.8 milli-inches is the best that is feasible. Thus, in the array mentioned above of 100×100 light emitting devices the bond pads on the perimeter of the semiconductor chip would have a minimum pitch of 4.8 milli-inches, with 50 bond pads situated along each edge of the perimeter. As more devices are included in the array, more bond pads are required and the perimeter size to accommodate the additional bond pads increases at an even greater rate. That is, since the minimum pitch of the bonding pads is 4.8 milli-inches, the pitch of the devices in the array can be as large as 2.4 milli-inches, or approximately 61 microns, without effecting the size of the substrate. Thus, even if the devices can be fabricated smaller than 61 microns, the minimum pitch of the bonding pads will not allow the perimeter of the substrate to be made any smaller. It can quickly be seen that the size of the substrate is severely limited by the limitations of the wire bonding technology.

Disclosed in the present invention is an electro-optical package comprised of a two-dimensional LED array display chip, mounted directly on an upper major surface of a molded opaque base having defined therein a central opening, an optical element being formed within or atop the central opening, and a means for interfacing with additional components providing at least one drive circuit. The two-dimensional LED array display chip for image manifestation apparatus applications is composed of a plurality of LEDs (one or more of which form a pixel) arranged in rows and columns to form a two-dimensional X-Y addressing pattern.

The two-dimensional LED display chip is mounted on the upper major surface of the molded opaque base having electrical interconnects, connection/mounting pads, embedded leadframes, and/or plated through-hole vias formed therein. The base component has formed within the central opening or positioned thereon, an optical element. The optical element is formed subsequent to the molding of the base component as either an injection molded refractive or diffractive lens, formed within the central opening, or as an injection molded optically transparent substrate, formed within the central opening, thereafter having a refractive or diffractive surface formed on an upper major surface utilizing a stamping or pressing process. There are provided means for electrical interfacing to a printed circuit board and drive circuits. Together with the LED display chip, the molded base component with optical lens, the printed circuit board, and the drive circuits form the integrated electro-optical package of the present invention.

Accordingly, it would be highly advantageous to provide for an integrated electro-optical package which has contained therein, a display mounted to a molded plastic opaque base component defining a central opening and having formed therein an optical element and means for interfacing with a printed circuit board and drive circuits, such as through, patterned electrical interconnects, connection/mounting pads, embedded lead frames and/or plated through-hole vias.

Thus, there is a need for interconnect and packaging structures and techniques in which LED arrays, optical elements and electronic circuitry can be conveniently incorporated There is also a need for interconnect and packaging structures and techniques which can substantially reduce the imitation on size of the electro-optical package.

It is a purpose of the present invention to provide for integrated electro-optical packages in which an LED array, an opaque base component defining a central opening, having formed therein an optical element, and electrical interconnects can be conveniently incorporated.

It is a purpose of the present invention to provide integrated electro-optical packages which are substantially smaller than previous integrated packages.

It is also a purpose of this invention to provide a package incorporating a novel method of fabricating a two-dimensional LED array, forming an LED display chip, mounted on the surface of a molded base component, having formed therein a central opening, an optical element and interconnects, that in combination with additional optical elements, provides for high density information image manifestation apparatus applications.

It is another purpose of the present invention to provide integrated electro-optical packages with organic LEDs which are not limited in size by the electrical connections.

It is still another purpose of this invention to provide for the inclusion of a package incorporating electrical connections that penetrate the molded base to provide a region for mounting a printed circuit board and driver chips.

It is still another purpose of the present invention to provide integrated electro-optical packages which contain a LED display chip directly mounted onto a plastic molded base, having formed therein patterned electrical interconnects, embedded lead frames, and/or plated through-hole vias, and further having an injection molded, stamped or pressed optical element thereby reducing the size and manufacturing cost of the package.

SUMMARY OF THE INVENTION

The above problems and others are substantially solved and the above purposes and others are realized in an integrated electro-optical package including an LED display chip, formed of an optically transparent substrate having a major surface with an array of light emitting devices formed on the major surface at a central portion thereof and cooperating to generate a complete image. Each of the light emitting devices have first and second electrodes for activating the light emitting devices. The optically transparent substrate further has external connection/mounting pads formed adjacent outer edges thereof and outside of the central portion of the major surface with the first electrodes of the light emitting devices being connected to a first plurality of the external connection/mounting pads and the second electrodes of the light emitting devices being connected to a second plurality of the external connection/mounting pads.

A base, formed as a molded component, having a major surface and defining a central opening substantially coextensive with the image at the central portion of the major surface of the optically transparent substrate of the LED display chip. The molded base component further has a plurality of electrical conductors formed therein, each extending from a plurality of connection/mounting pads formed adjacent an edge of the central portion, to a plurality of means for electrical connection, e.g., connection/mounting pads, interfaced with a surface mounted or embedded leadframe, and/or plated through-hole vias, formed about the periphery of the molded base, on the major surface. The molded base is formed of a molded opaque plastic, or some other suitable material, defining a monolithic, centrally located opening or "window". Subsequent to the molding of the base component, a lens is formed within the window through injection molding or in the alternative an optically transparent substrate can be injection molded into the window opening, thereafter having a refractive or diffractive surface stamped or pressed onto its upper major surface. A plurality of connection/mounting pads and electrical conductors are formed as a frame around the lens. The LED display chip is mounted on the major surface of the molded base component, using flip chip bump bonding known in the art, with the first and second pluralities of external connection/mounting pads being in electrical contact with the connection/mounting pads of the molded base component formed as a frame around the lens.

There is provided a driver component having a plurality of conductors formed therein, in electrical contact with the means for electrical connection, e.g., the connection/mounting pads formed about the periphery of the molded base component. A plurality of driver and controller circuits are mounted on the driver substrate and have data input terminals and further have control signal output terminals connected to the first and second terminals of the light emitting devices for activating the light emitting devices to generate images in accordance with data signals applied to the data input terminals utilizing patterned electrical interconnects, connection/mounting pads, mounting pins, embedded leadframes and/or plated through hole vias.

In the preferred embodiment a plurality of external connection/mounting pads of an LED chip are bump bonded to a plurality of connection/mounting pads adjacent an edge of a central portion of a molded base component to substantially reduce the allowable pitch of the connection/mounting pads. Also, a plurality of connection/mounting pads on a major surface of a driver substrate are positioned into a matrix of rows and columns to allow a substantially greater number of connections in a substantially smaller surface area.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 7 is a simplified sectional view of the components of FIGS. 5 and 6, assembled into a complete package;

FIG. 8 is an enlarged sectional view of the components of FIG. 5, portions thereof broken away, assembled into a complete package;

FIG. 16 is a view in perspective of a portable communications receiver incorporating the miniature virtual image display of FIG. 9;

FIG. 17 is a simplified view generally as seen from the line 17—17 of FIG. 16;

DESCRIPTION OF THE PREFERRED EMBODIMENT

Figure 1:
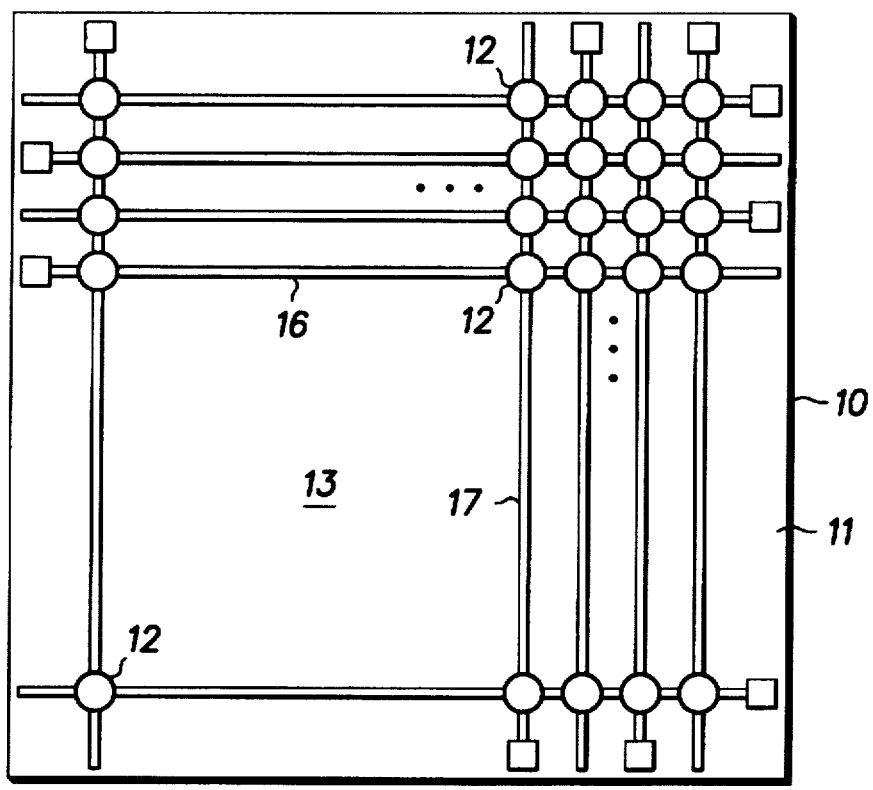
FIG. 1 is a greatly enlarged view in top plan of a partial array of light emitting devices formed on an optically transparent substrate.

During the course of this description, like numbers are used to identify like elements according to the different figures that illustrate the invention. It should be understood that a wide variety of light emitting devices, including liquid crystal displays (LCDs), light emitting diodes (LEDs), vertical cavity surface emitting lasers (VCSELs), etc. can be utilized in the present invention. Referring specifically to FIG. 1, a greatly enlarged view in top plan of an optically transparent substrate 10 having an array 15 of light emitting devices thereon is illustrated. For simplicity of illustration, only a representative portion of optically transparent substrate 10 has been completed. Optically transparent substrate 10 has an uppermost major surface 11 with a plurality of light emitting devices 12 formed thereon. Light emitting devices 12 are organic/polymer electroluminescent elements or light emitting devices. Hereinafter, for simplification of this disclosure, the term organic/polymer will be shortened to "organic". In this embodiment, each of the light emitting devices 12 defines a pixel, with light emitting devices 12 positioned in rows and columns and cooperating to generate a complete image, when activated, at a central portion 13 of major surface 11.

Figure 2:
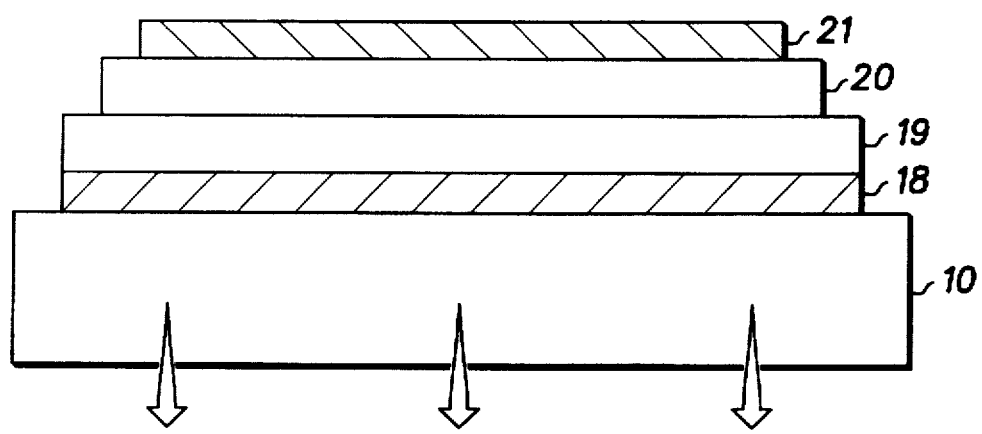
FIG. 2 is a simplified cross-sectional view of a single organic electroluminescent element on a glass substrate.

Referring specifically to FIG. 2, a simplified and greatly enlarged cross-sectional view of a single organic light emitting device 12 on optically transparent substrate 10, which in this embodiment is optically transparent glass, is illustrated. Light emitting device 12 includes a layer 18 of conductive material which serves as the anode of the light emitting device 12 in this specific embodiment. An organic layer or layers 19/20 includes one or more layers of polymers or low molecular weight organic compounds. The organic materials that form the layers are chosen for their combination of electrical and luminescent properties, and various combinations of hole transporting, electron transporting, and luminescent materials can be used. In this embodiment, for example, layer 19 is a hole transport layer and layer 20 is a luminescent electron transport layer. A second layer 21 of conductive material is deposited on the upper surface of layers 19/20 and serves as the cathode in this specific embodiment. For illustrative purpose, the directional arrows shown in FIG. 2, are meant to illustrate the direction of the light emitted by the light emitting device 12.

Generally, either the anode or the cathode must be optically transparent to allow the emission of light therethrough. In this embodiment layer 18 is formed of indium-tin oxide (ITO) which is optically transparent. In some applications a very thin metal film may be used as a transparent conductor instead of the ITO. Also, to reduce the potential required, the cathode is generally formed of a low work function metal/conductors or combination of metals/conductors, at least one of which has a low work function. In this embodiment the cathode is formed of low work function material, such as heavily doped diamond, or the cathode may be a conductive metal incorporating cesium, calcium or the like. The first electrodes, e.g. the anodes, of light emitting devices 12 are connected by a plurality of horizontal electrical conductors 16 to define rows of pixels, and the second electrodes, e.g. the cathodes, of light emitting devices 12, are connected by a plurality of vertical electrical conductors 17 to define columns of pixels, thereby forming an LED display chip 14, from an addressable array 15 of light emitting devices 12.

A list of some possible examples of materials for the organic layer or layers 19/20 of the above described light emitting device 12 follows. As a single layer of polymer, some examples are: poly(p-phenylenevinylene) (PPV); poly (p-phenylene) (PPP); and poly[2-methoxy,5-(2'-ethylhexoxy)1,4-phenylenevinylene] (MEH-PPV). As an electron transporting electroluminescent layer between a hole transporting layer or one of the single layer polymers listed above and a low work function metal cathode, an example is: 8-hydroxquinoline aluminum (ALQ). As an electron transporting material, an example is: 2-(4-tert-butylphenyl)-5-(p-biphenylyl)-1,3,4-oxadiazole (butyl-PBD). As a hole transport material, some examples are: 4,4'-bis[N-phenyl-N-(3-methylphenyl)amino]biphenyl (TPD); and 1,1-bis(4-di-p-tolyaminophenyl)cyclohexane. As an example of a fluorescent that may be used as a single layer or as a dopant to an organic charge transporting layer is coumarin 540, and a wide variety of fluorescent dyes. Examples of low work function metals include: Mg:In, Ca, and Mg:Ag.

Light emitting devices 12 are formed on optically transparent substrate 10 in a central portion 13 of major surface 11 less than approximately 20 microns in diameter, in the embodiment illustrated approximately 10 microns in diameter. Also, the pitch, or spacing between centers of light emitting devices 12, is less than approximately 30 microns, and in the present embodiment is 20 microns.

Figure 3:
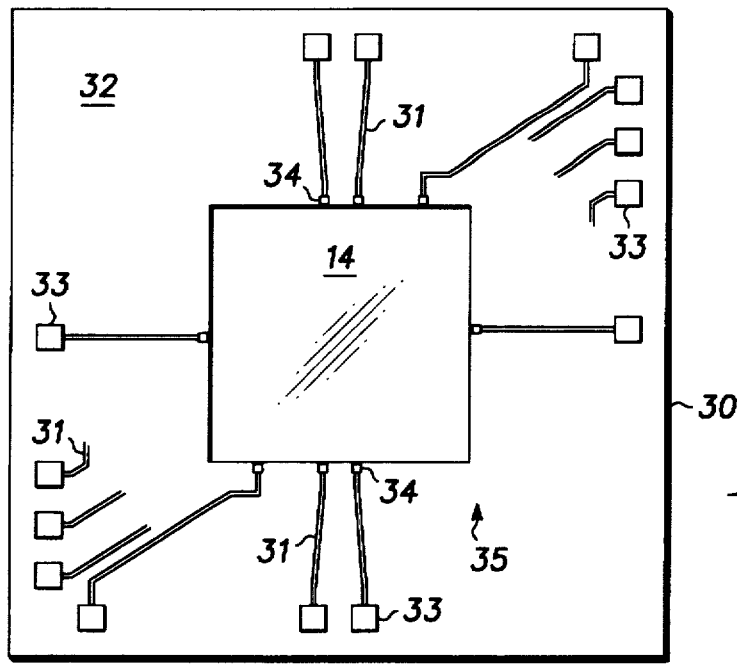
FIG. 3 is an enlarged view in top plan of an LED display chip mounted on a molded opaque base component defining a central window portion, including electrical connections.

Referring specifically to FIG. 3, an enlarged view in top plan of LED display chip 14, positioned on a molded optically opaque base 30 is illustrated. In the simplest embodiment, molded base 30 is a separate component, formed of a planar piece of opaque material, such as molded plastic, resin or other material suitable for the purposes stated herein, defining a central opening or "window" therein (not shown). Molded base 30 has formed within the central opening, a refractive or diffractive lens (not shown), that is substantially the same size as array 15 of light emitting devices 12 so that the image generated by light emitting devices 12 in cooperation is completely visible therethrough, once LED display chip 14 is properly registered on base 30, utilizing standard bump bonding techniques. The refractive or diffractive lens can be formed by either injection molding of the lens into the central opening or by injection molding a transparent substrate in the central opening, and thereafter stamping or pressing the lens surface onto the upper major surface of the substrate. Disclosed in the preferred embodiment are a plurality of electrical conductors 31, each extending from a connection/mounting pad 34 on a major surface 32 of molded base 30, adjacent an edge of a central portion, to a connection/mounting pad 33, positioned about the outer periphery of base 30, to electrically connect the rows and columns of light emitting devices 12 to connection/mounting pads 33. It is additionally disclosed to use surface mounted or embedded leadframes, and or plated through-hole vias to form the required means for electrically connecting the components together. To completely distribute electrical conductors 31 and connection/mounting pads 33 around the periphery of molded base 30, electrical conductors 31 are attached to alternate horizontal electrical conductors 16 and alternate vertical electrical conductors 17 of LED display chip 14, as illustrated in FIG. 1. Thus, the space available between adjacent electrical conductors 31 is 2P, or in this specific embodiment 20 microns.

By fanning out electrical conductors 31, connection/mounting pads 33 and/or plated through-hole vias can be constructed large enough to provide easy electrical contact thereto. For example, if array 15 of light emitting devices 12 includes 40,000 devices (e.g., 200×200) and each device includes an area having a 10 micron diameter with a pitch P of 20 microns, then the area of a central opening 35 of molded base 30 will be less than 0.2 inches on a side. Molded base 30, in this specific embodiment, is constructed with a central opening 35 approximately 0.2 inches on a side and an outer periphery of 0.5 inches on a side. Thus, the 200 connection/mounting pads on each side of the periphery of molded base 30 have approximately 60 microns of pitch available.

Molded base 30 is formed of molded plastic, more specifically, a substantially opaque, transfer or injection resin, having a coefficient of thermal expansion (CTE) of 15–20 ppm. Electrical conductors 31 and connection/mounting pads 33 and 34 can be formed from surface embedded copper leads, solder paste screen print interconnects, gold plated interconnects or metal evaporation. In addition, sol-gel technology, incorporating the usual steps of printing, patterning, and fusing can be utilized, as well as standard thin film metallization in which layers of metal are deposited by, for example, sputtering. In a typical metallization system, a first layer of chromium is applied by sputtering to operate as an adhesive layer on molded base 30. A second layer of copper is applied over the chromium to provide the desired electrical conduction and a layer of gold is applied over the copper to provide a barrier and adhesive layer for further connections. It should be understood that the metallization can be either an additive or subtractive method with the patterning and etching being performed by any of the various methods well known in the art to provide the desired final structure.

In many applications the width of electrical conductors 31 and the sizes of connection/mounting pads 33 and 34, as well as spacing, may be such that difficulty will be encountered in the fabrication of base 30. However, plastic is an example of a material on which 10 to 15 micron wide electrical conductors with a pitch of 40 microns can be fabricated.

Figure 4:
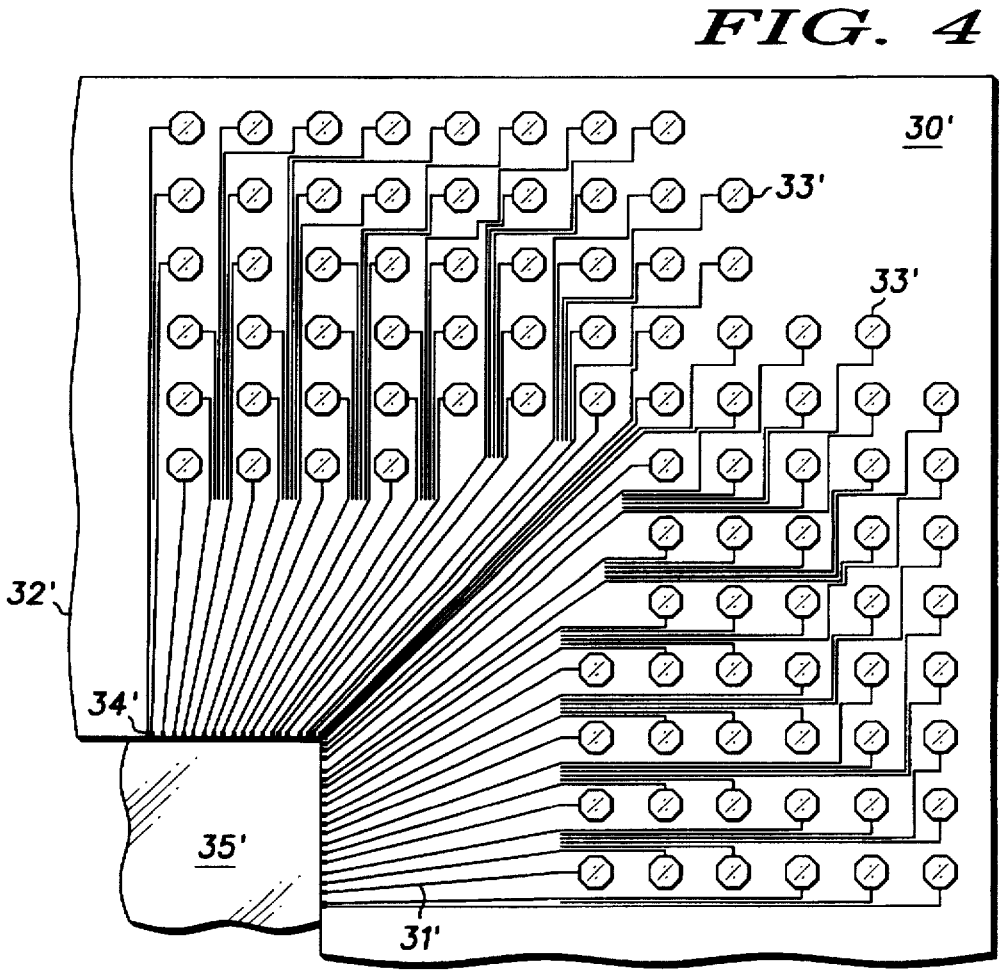
FIG. 4 is a greatly enlarged view in top plan of another embodiment of a molded base component, portions thereof broken away.

Referring specifically to FIG. 4, a greatly enlarged view in top plan of another embodiment of a molded base 30', portions thereof broken away, is illustrated. It should be noted that all components similar to the components illustrated in FIGS. 1 and 3, are designated with similar numbers, having a prime added to indicate the different embodiment. At least a central opening or "window" 35' is positioned to receive a LED display chip 14 thereon as described in conjunction with FIG. 3. A refractive or diffractive lens is formed within or in alignment with central opening 35', as previously described for FIG. 3. A plurality of electrical conductors 31' are positioned on a major surface 32' of molded base 30' and are fanned out from a plurality of connection/mounting pads 34', positioned about the periphery of central opening 35', into contact with a plurality of connection/mounting pads 33' and/or plated through-hole vias, or surface mounted or embedded leadframes (not shown). Connection/mounting pads 33' are positioned in a matrix of rows and columns on major surface 32' surrounding central opening 35'. Generally, it is anticipated that connection/mounting pads 33' can be positioned in the matrix with a pitch in the range of approximately 25 milli-inches to 50 milli-inches to allow sufficient space for electrical conductors 31' to extend therebetween as illustrated. For example, a matrix of connection/mounting pads 33' with a pitch of 40 milli-inches allows over 500 connection/mounting pads 33' on a one inch by one inch base with a central opening 35' of 0.2 inches by 0.4 inches.

Figure 5:
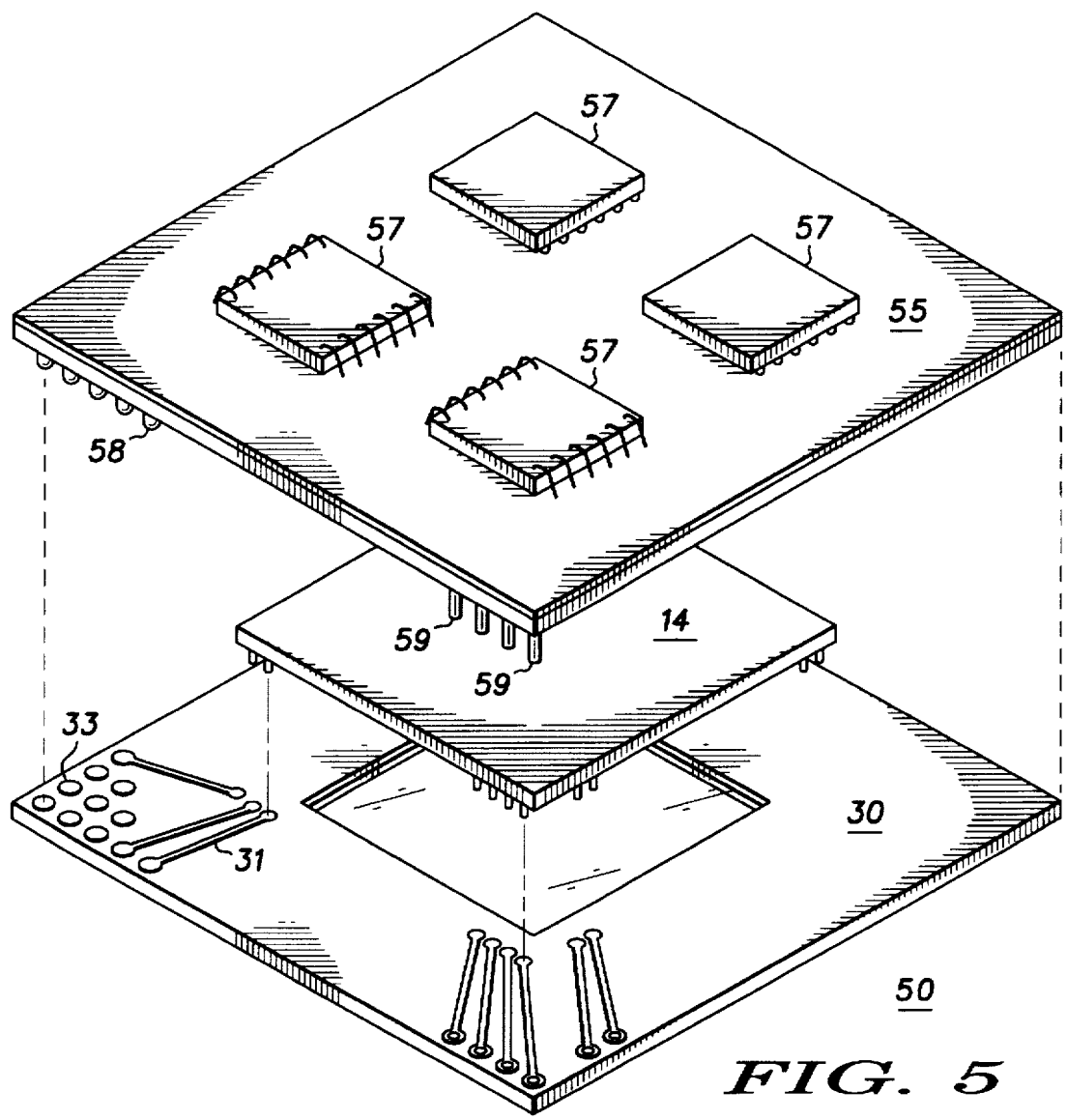
FIG. 5 is an exploded view in perspective illustrating the relative positions of the components of an electro-optical package in accordance with the present invention.
Figure 6:
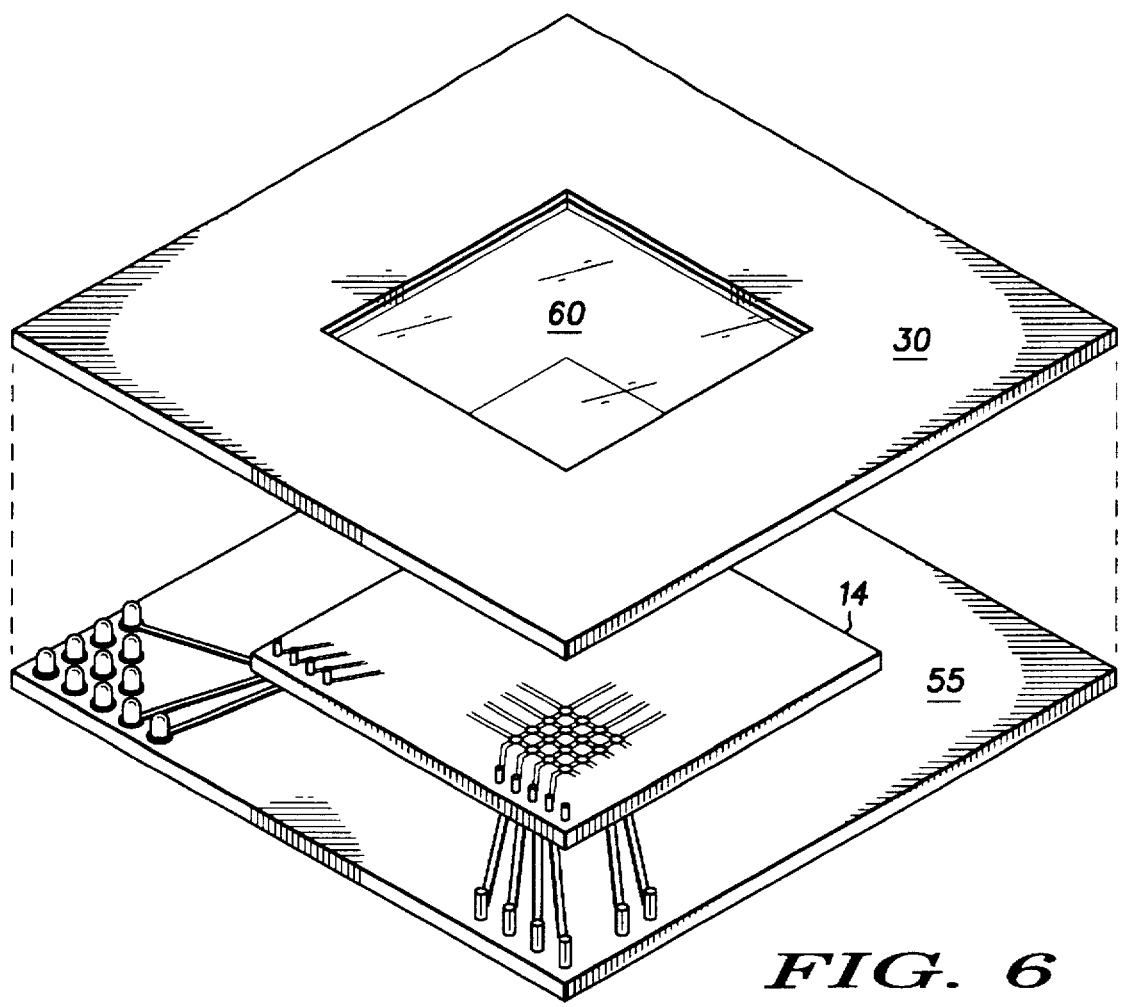
FIG. 6 is an exploded view in perspective, in oppositely viewed direction from FIG. 5, illustrating the relative positions of the components of an electro-optical package in accordance with the present invention.

Exploded views, in perspective, illustrating the relative positions of the components of an electro-optical package 50 are illustrated in FIGS. 5 and 6, FIG. 5 being viewed from a top side and FIG. 6 being viewed from an underneath side. Enlarged sectional views, portions thereof broken away, of the components of FIG. 5 assembled into a complete electro-optical package 50 are illustrated in FIGS. 7 and 8. In addition to LED display chip 14 and molded base 30, a mounting board, or driver substrate, 55 is included having a plurality of driver and control circuits 57 mounted on an upper major surface thereof. Driver substrate 55 has a first major surface and a second opposed major surface and defining a central area (not shown) in the first major surface, substantially coextensive with the complete image at the central portion of the major surface of the optically transparent substrate 10. Driver and control circuits 57 generally are formed as smaller integrated circuits which are wire bonded or bump bonded to electrical contacts on the second opposed major surface of driver substrate 55. Driver substrate 55 is, for example, a convenient printed circuit board, such as FR4 or the like, and has either bumps 58 of contact material, such as C5 solder, solderable plated metal, or the like, or connecting pins 59 positioned on a lower major surface thereof. In some specific applications, driver substrate 55 could be a single semiconductor chip, having all of the driver and interconnect components integrated thereon. Because the pitch of connection/mounting pads 33, or plated through-hole vias, on molded base 30 is (or can be) relatively large, relatively large bumps 58 or pins 59 can be utilized at this point.

Bumps 58 (if utilized) and those used in interfacing LED display chip and molded base 30 (previously discussed) are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. For smaller pitches, 5 micron diameter copper bumps with a pitch of 10 microns have been formed with a bump height of 20 microns. Also, 15 micron diameter gold bumps on a 30 micron pitch have been formed to a height of 30 to 45 microns. Some compatible metal may improve the assembly procedures, e.g., gold metallization or gold plating on connection/mounting pads 33 of molded base 30.

In the assembly process, molded base 30 is positioned so that major surface 11 is up and connection/mounting pads 33, or through-hole vias, are positioned to each contact a separate bump 58, or mounting pin, on driver substrate 55 when molded base 30 and driver substrate 55 are properly registered, as illustrated in FIGS. 7 and 8. In one fabrication technique, molded base 30 includes gold connection/ mounting pads 33 and is thermo-compression bonded to driver substrate 55. In an alternative fabrication technique, molded base 30 can utilize plated through-hole vias with driver substrate 55, having a defined central opening, and being mounted (not shown) on a major surface of molded base 30, opposite the mounting of LED display chip 14. LED display chip 14 also includes gold connection/ mounting pads and is flip chip thermo-compression bonded to molded base 30. At the point illustrated in FIGS. 5 and 6 where electro-optical package 50 is substantially complete, molded base 30 and LED display chip 14 can be easily tested and/or burned in prior to additional assembly of the package. This ability to provide an intermediate test point can be a substantial cost and time saving in the packaging procedure.

The final element in electro-optical package 50 is a lens 60 which is formed using injection molding techniques or stamping of an optically transparent substrate as previously described. Lens 60 is designed to magnify the image generated by array 15 of light emitting devices 12 of LED display chip 14. Lens 60, is preferably a refractive or diffractive lens that is molded into the central opening 35 of base 30 utilizing injection molding techniques, or stamped onto an upper major surface of an optically transparent substrate that has been injection molded into central opening 35 of base 30.

The interstice between driver substrate 55 and molded base 30 mounted thereon is filled with an optically transparent material 61, (shown in FIGS. 7 and 8), which may be any convenient material to provide support and make electro-optical package 50 a more robust package. Depending upon the material utilized in the formation of array 15 of light emitting devices 12 and the placement of driver substrate 55, a cavity 62 or window opening (not shown) may be formed in driver substrate 55 to receive LED display chip 14 or to provide an opening through which the generated image passes as previously described. In the first instance, and as illustrated in FIGS. 7 and 8 the edges of LED display chip 14 can be positioned sufficiently close to driver substrate 55 to act like an encapsulant dam so that the interstice between the upper surface of LED display chip 14 and driver substrate 55 is left open or unfilled. Thus, LED display chip 14 and driver substrate 55 are not physically attached together and different coefficients of expansion will have little or no effect.

It should be understood that for best results molded base 30 and optically transparent material 61 should be constructed with indices of refraction which are as close together as practical. If, for example, the index of refraction of molded base 30 and material 61 differs substantially there is a tendency for light to reflect back from optically transparent substrate 10 and the efficiency of electro-optical package 50 is reduced. Generally, an index of refraction of approximately 1.5 for molded base 30 and material 61 has been found to be acceptable.

In addition, an optically transparent substrate of glass or the like, such as optically transparent substrate 10, has the added advantage of providing additional environmental protection for array 15 of light emitting devices 12. In that transparent material, such as glass and the like can be provided which has a coefficient of thermal expansion which is the same as, or very close to, the coefficient of thermal expansion of the driver substrate 55, substantial improvements in thermal cycling life are achieved with this package.

Figure 10:
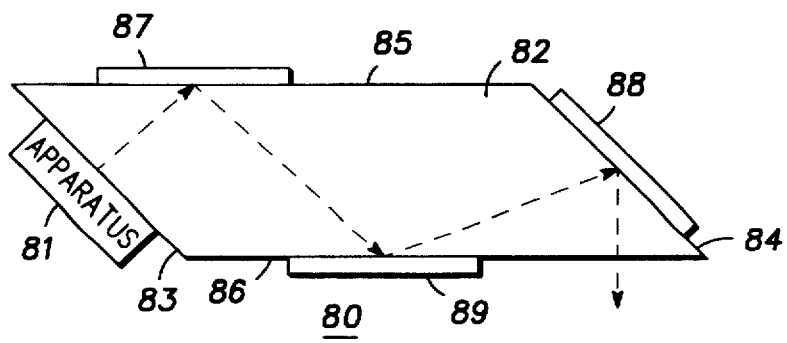
FIGS. 10 and 11 are additional simplified schematic views, similar to FIG. 9, of other miniature virtual image displays incorporating the package of FIGS. 5 and 6.
Figure 11:
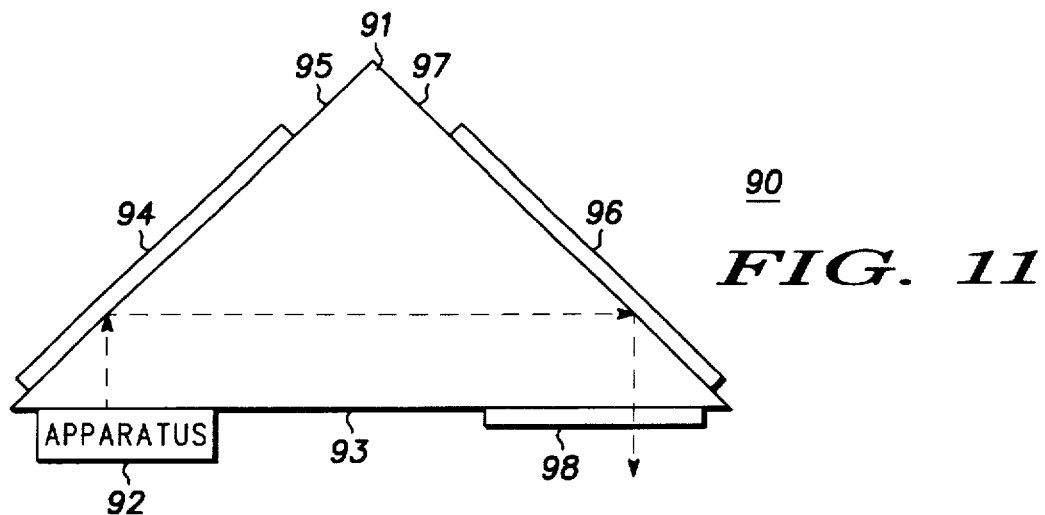

It should be understood that the image generated by the array of light emitting devices 12 on optically transparent substrate 10 is too small to properly perceive (fully understand) with the human eye and generally requires a magnification of at least 10× for comfortable and complete viewing. Lens 60 can be formed as a single lens with additional optical magnification supplied by an external system or lens 60 can be formed as a complete magnification system. Several examples of optical magnification systems which may be incorporated into lens 60 or applied externally thereto are illustrated in FIGS. 9 through 11, explained below.

Figure 9:
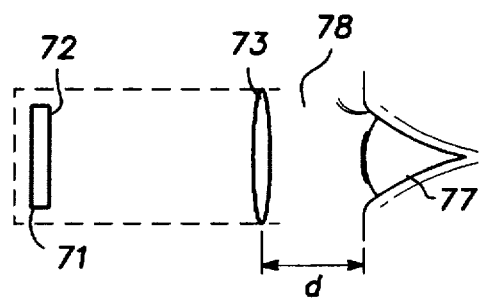
FIG. 9 is a simplified schematic view of a miniature virtual image display incorporating the package of FIG. 5.

Referring to FIG. 9, a miniature virtual image display 70 is illustrated in a simplified schematic view. Miniature virtual image display 70 includes image generation apparatus 71, similar to electro-optical packages 50 described above, for providing an image on a surface 72. An optical system, represented by lens system 73, is positioned in spaced relation to surface 72 of miniature virtual image display 70 and produces a virtual image viewable by an eye 77 spaced from an aperture 78 defined by lens system 73.

As technology reduces the size of the electro-optical package and/or the light generating devices contained within, greater magnification and smaller lens systems are required.

Lens system 73, represented schematically by a single lens, is mounted in spaced relation from surface 72 so as to receive the image from surface 72 and magnify it an additional predetermined amount. It will of course be understood that the lens system may be adjustable for focus and additional magnification, if desired, or may be fixed in a housing for simplicity.

Eye relief is the distance that eye 77 can be positioned from viewing aperture 78 and still properly view the image, which distance is denoted by "d" in FIG. 10. Because of the size of lens system 73, eye relief, or the distance d, is sufficient to provide comfortable viewing and in the present embodiment is great enough to allow a viewer to wear normal eyeglasses, if desired. Because of the improved eye relief the operator can wear normal corrective lenses (personal eyeglasses), and the complexity of focusing and other adjustable features can be reduced, therefore, simplifying the construction of miniature virtual image display 70.

Referring to FIG. 10, another miniature virtual image display is illustrated in a simplified schematic. In waveguide virtual image display 80, image generation apparatus 81, similar to electro-optical package 50 described above, is affixed to the inlet of an optical waveguide 82 for providing an image thereto. Optical waveguide 82 is formed generally in the shape of a parallelogram (side view) with opposite sides, 83, 84 and 85, 86, equal and parallel but not perpendicular to adjacent sides. Side 83 defines the inlet and directs light rays from the image at image generation apparatus 81 onto a predetermined area on adjacent side 85 generally along an optical path defined by all four sides. Three diffractive lenses 87, 88 and 89 are positioned along adjacent sides 85, 84 and 86, respectively, at three predetermined areas and the magnified virtual image is viewable at an outlet in side 86. This particular embodiment illustrates a display in which the overall size is reduced somewhat and the amount of material in the waveguide is reduced to reduce weight and material utilized.

Referring to FIG. 11, another specific miniature virtual image display is illustrated in a simplified schematic. In waveguide virtual image display 90 an optical waveguide 91 having a generally triangular shape in side elevation is utilized. Image generation apparatus 92, similar to electro-optical package 50 described above, for producing an image, is affixed to a first side 93 of optical waveguide 91 and emanates light rays which travel along an optical path directly to a diffractive lens 94 affixed to a second side 95. Light rays are reflected from lens 94 to a diffractive lens 96 mounted on a third side 97. Diffractive lens 96 in turn reflects the light rays through a final refractive lens 98 affixed to the outlet of optical waveguide 91 in side 93, which refractive lens 98 defines a viewing aperture for waveguide virtual image display 90. In this particular embodiment the sides of waveguide virtual image display 90 are angularly positioned relative to each other so that light rays enter and leave the inlet and outlet, respectively, perpendicular thereto.

Figure 12:
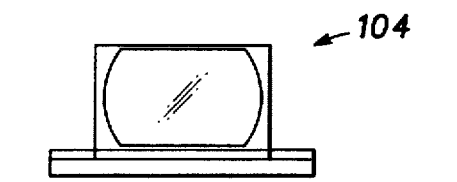
FIGS. 12, 13, and 14 illustrate a front view, side elevational view, and a top plan, respectively, of an image manifestation apparatus utilizing the integrated electro-optical package of the present invention.
Figure 13:
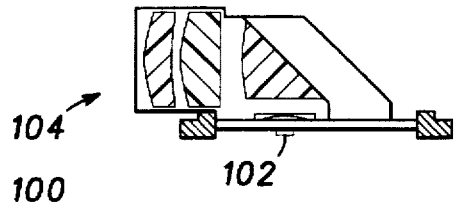
Figure 14:
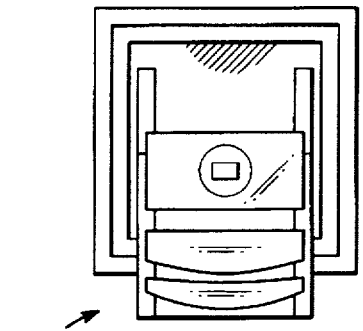

Referring now to FIGS. 12, 13 and 14, another miniature virtual image display 100 in accordance with the present invention, is illustrated in a front view, side elevational view, and top plan, respectively. FIGS. 12, 13 and 14 illustrate miniature virtual image display 100 approximately the actual size to provide an indication as to the extent of the reduction in size achieved by the present invention. Miniature virtual image display 100 includes an integrated electro-optical package 102 (generally similar to package, 50) which includes, in this specific embodiment, 144 pixels by 240 pixels. Each pixel is fabricated approximately 20 microns on a side with a center-to-center spacing between adjacent pixels of no more than 20 microns. In a preferred embodiment, integrated electro-optical package 102 produces a luminance less than approximately 15 fL. This very low luminance is possible because miniature virtual image display 100 produces a virtual image. Integrated electro-optical package 102 is mounted onto lens system 104, which magnifies the image approximately 15× to produce a virtual image approximately the size of an 8.5"×11" sheet of paper.

Here is should be noted that because integrated electro-optical package 102 is very small and the fact that a virtual image is utilized, rather than a direct view display, the overall physical dimensions of miniature virtual image display 100 are approximately 1.5 inches (3.8 cm) wide by 0.75 inches (1.8 cm) high by 1.75 inches (4.6 cm) deep, or a total volume of approximately 2 cubic inches (32 cm$^3$).

Figure 15:
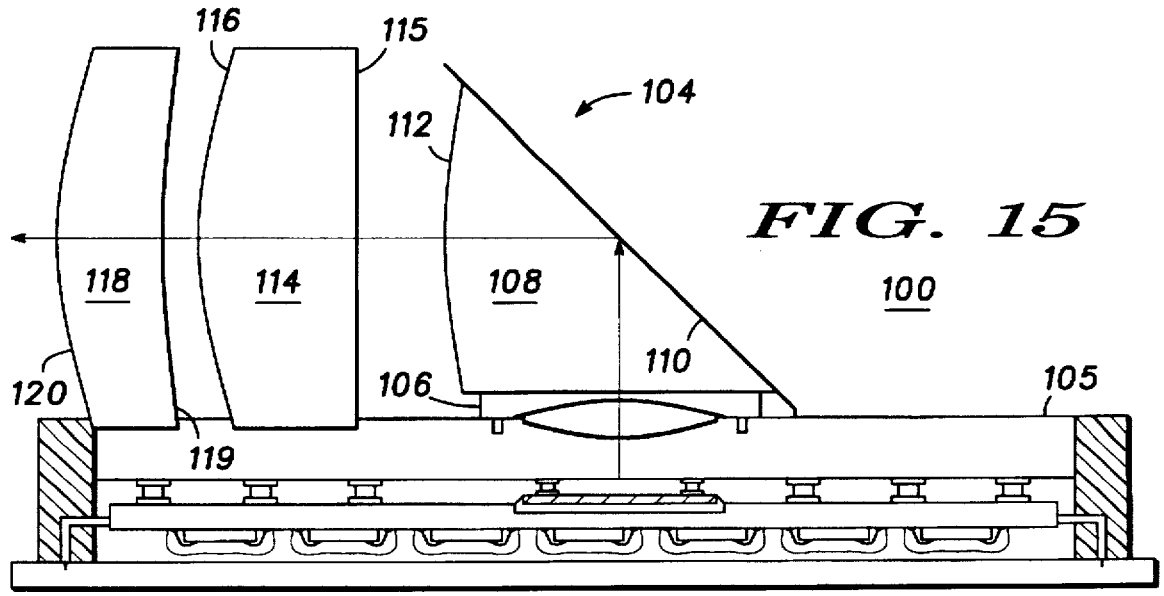
FIG. 15 is a 4× magnified view in side elevation of the apparatus OF FIG. 14.

Referring specifically to FIG. 15, a 4× magnified view in side elevation of miniature virtual image display 100 of FIG. 13 is illustrated for clarity. From this view it can be seen that a first optical lens 106 is affixed directly to the upper surface of a molded plastic base 105 (generally similar to base 30). An optical prism 108 is mounted to reflect the image from a surface 110 and from there through a refractive surface 112. The image is then directed to an optical lens 114 having a refractive inlet surface 115 and a refractive outlet surface 116. From optical lens 114 the image is directed to an optical lens 118 having an inlet refractive surface 119 and an outlet refractive surface 120. Also, in this embodiment at least one diffractive optical element is provided on one of the surfaces, e.g. surface 110 and/or refractive inlet surface 115, to correct for chromatic and other aberrations. The operator looks into outlet refractive surface 120 of optical lens 118 and sees a large, easily discernible virtual image which appears to be behind miniature virtual image display 100.

FIG. 16, illustrates an example of a portable equipment device, namely a portable communications receiver 130 having a hand held microphone 131 with a miniature virtual image display 132 mounted therein It will of course be understood that portable communications receiver 130 can be any of the well known portable receivers, such as a cellular or cordless telephone, a two-way radio, a pager, a data bank, etc. In the present embodiment, for purposes of explanation only, portable communications receiver 130 is a portable two-way police radio, generally the type carried by police officers on duty or security guards. Portable communications receiver 130 includes a control panel 134 for initiating calls and a standard visual display 136, if desired, for indicating the number called or the number calling. Hand held microphone 131 has a push-to-talk switch 138 and a voice pick-up 140.

Referring to FIG. 17, a simplified sectional view of hand held microphone 131, as seen from the line 17—17 of FIG. 16, is illustrated. Miniature virtual image display 132 includes an electro-optical package similar to electro-optical package 50, described above, having image generation apparatus 141 for providing an image to a fixed optical system 142, which in turn produces a virtual image viewable by the operator through an aperture 144. Fixed optical system 142 is constructed to magnify the entire image from image generation apparatus 141, without utilizing moving parts, so that the virtual image viewable through aperture 144 is a complete frame, or picture, which appears to be very large (generally the size of a printed page) and is easily discernible by the operator. The entire electro-optical package is relatively small and adds virtually no additional space requirements to hand held microphone 131. Optical system 142 is constructed with no moving parts, other than optional features such as focusing, zoom lenses, etc. Further, image generation apparatus 141 requires very little electrical power to generate the image and, therefore, adds very little to the power requirements of portable communications receiver 130.

Figure 18:
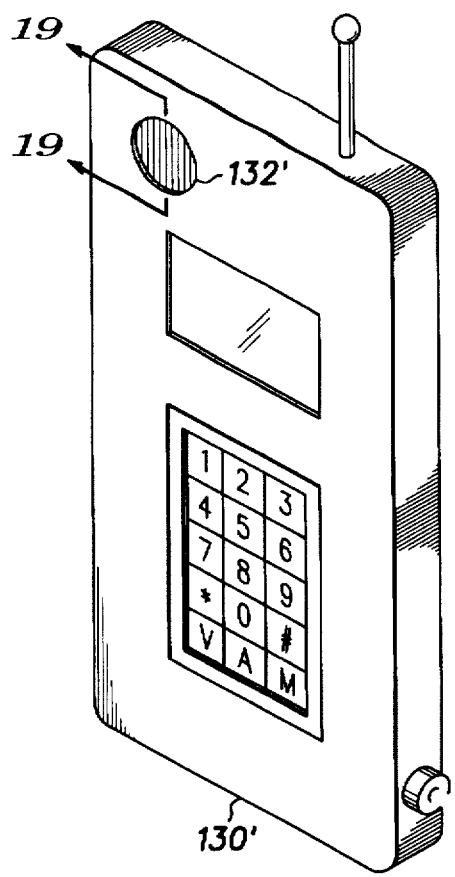
FIG. 18 is a view in perspective of another portable communications receiver incorporating the miniature virtual image display of FIG. 9.
Figure 19:
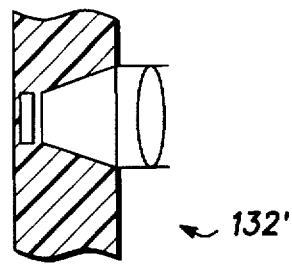
FIG. 19 is a simplified view generally as seen from the line 19—19 of FIG. 18.

Referring specifically to FIGS. 18 and 19, a second embodiment is illustrated wherein parts similar to those described in relation to FIGS. 16 and 17 are designated with similar numbers with a prime added to the numbers to indicate a different embodiment. In this embodiment a portable communications receiver 130' has a miniature virtual image display 132' included in the body thereof, instead of in a hand held microphone. A hand held microphone is optional and this specific embodiment is desirable for instances where a hand held microphone is not utilized or not available or for use in pagers and the like which do not transmit. Miniature virtual image display 132' is basically similar to miniature virtual image display 132 of FIGS. 16 and 17 and adds very little to the size, weight, or power consumption of portable communications receiver 130'.

Figure 20:
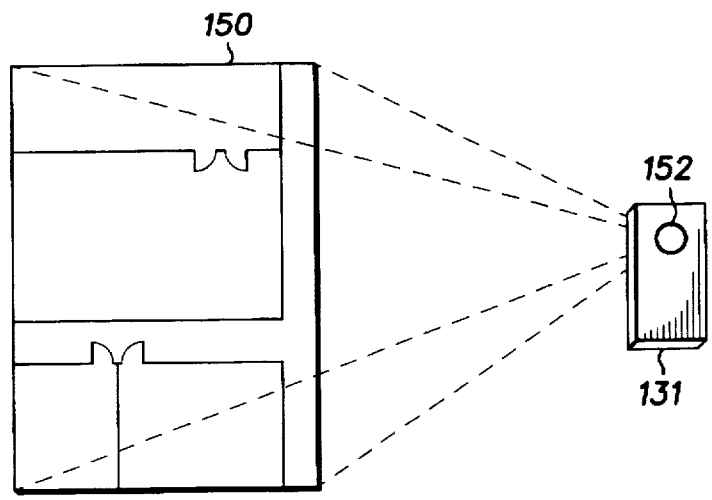
FIG. 20 is a view in perspective illustrating a typical view as seen by the operator of the portable communications receiver of FIG. 12.

FIG. 20 is a perspective view of hand held microphone 131 illustrating a typical view 150 seen by an operator looking into viewing aperture 152 of miniature virtual image display 132, described in conjunction with FIGS. 16 and 17. View 150 could be, for example, a floor plan of a building about to be entered by the operator (a policeman). In operation, the floor plan is on file at the police station and, when assistance is requested by the policeman, the station simply transmits video representative of the previously recorded plan. Similarly, miniature virtual image display 132 might be utilized to transmit pictures of missing persons or wanted criminals, maps, extremely long messages, etc. Many other variations, such as silent receiver operation wherein the message appears on miniature virtual image display 132 instead of audibly, are possible.

It should be noted that in the prior art, pagers and other small receivers in which visual displays are desired, are especially handicapped by the size of the displays. Generally such displays are limited to a single short line of text or several digits, and the size of the display still dictates the size of the receiver. Further, the display is clearer and easier to read and, because it utilizes a virtual display, requires very little power for the operation thereof. In fact, the present display utilizing the electro-optical package of the present invention uses much less power than any of the direct view displays normally utilized in electronic equipment and, as a result, can be fabricated in much smaller sizes.

Thus, the present invention illustrates and teaches integrated electro-optical packages having molded optical components that are not limited in size by the electrical connections and optics and which are substantially smaller than previous integrated packages which perform the same functions. Also, the present invention illustrates and teaches integrated electro-optical packages which contain arrays of light generating devices formed on a substrate, mounted on a molded base component, in combination with optical elements formed therein so as to create a generally monolithic base and lens component.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated electro-optical package comprising:
   an optically transparent substrate with an array of light emitting devices formed thereon and cooperating to generate a complete image, the array of light emitting devices being positioned in rows and columns to define all pixels of the complete image and operably connected to a plurality of connection pads adjacent outer edges of the optically transparent substrate; and
   a molded base defining a central opening, substantially coextensive with the complete image generated by the array of light emitting devices, having a plurality of connection pads formed on a surface surrounding the central opening, and a plurality of means for electrical connection formed on a surface about a periphery of the molded base, the plurality of connection pads and the plurality of means for electrical connection having electrical conductors extending therebetween, the plurality of connection pads of the array of light emitting devices being bump bonded to the plurality of connection pads of the molded base, the molded base further having formed therein the central opening, a lens, coextensive with the complete image generated by the array of light emitting devices and on a side of the molded base, opposite the array of light emitting devices, to receive and magnify the complete image and produce an easily viewable virtual image.

2. An integrated electro-optical package as claimed in claim 1 further comprised of a driver substrate defining a central area substantially coextensive with the complete image generated by the array of light emitting devices and having a plurality of connection pads formed about a periphery of the driver substrate, the driver substrate being electrically connected to the plurality of means for electrical connection of the molded base and a plurality of driver circuits positioned on the driver substrate and connected to the array of light emitting devices through the plurality of connection pads of the driver substrate and the plurality of means for electrical connection and the plurality of connection pads of the molded base and the plurality of connection pads of the optically transparent substrate.

3. An integrated electro-optical package as claimed in claim 1 wherein the optically transparent substrate is formed of optically transparent glass.

4. An integrated electro-optical package as claimed in claim 1 wherein the molded base is formed of opaque plastic.

5. An integrated electro-optical package as claimed in claim 4 wherein the opaque plastic is transfer molded.

6. An integrated electro-optical package as claimed in claim 1 wherein the plurality of means for electrical connection of the molded base are at least one of a plurality of connection pads, a plurality of surface mounted leadframes, a plurality of embedded leadframes, and a plurality of plated through-hole vias.

7. An integrated electro-optical package as claimed in claim 1 wherein the lens formed in the molded base is at least one of a diffractive lens and a refractive lens.

8. An integrated electro-optical package as claimed in claim 1 wherein the lens is injection molded into the central opening of the molded base.

9. An integrated electro-optical package as claimed in claim 1 wherein the lens is formed by injection molding an optically transparent substrate into the central opening of the molded base, and thereafter stamping a lens surface on an uppermost major surface of the optically transparent substrate formed within the central opening.

10. An integrated electro-optical package as claimed in claim 1 wherein the array of light emitting devices includes a plurality of organic electroluminescent elements.

11. An integrated electro-optical package as claimed in claim 10 wherein the plurality of organic electroluminescent elements each include a first conductive layer positioned on a major surface of the optically transparent substrate, at least one layer of organic material positioned on the first conductive layer, and a second conductive layer positioned on the at least one layer of organic material.

12. An integrated electro-optical package as claimed in claim 11 wherein the first conductive layer on the major surface of the optically transparent substrate includes a layer of indium-tin oxide.

13. An integrated electro-optical package as claimed in claim 11 wherein the at least one layer of organic material on the first conductive layer includes one of a layer of polymer and a layer of low molecular weight organic compound.

14. An integrated electro-optical package comprising:
   a light emitting device display chip comprised of an optically transparent substrate having a major surface with an array of light emitting devices formed on the major surface at a central portion thereof and cooperating to generate a complete image, each of the light emitting devices having a first electrode and a second electrode for activating the light emitting devices and having electrical conductors formed on the major surface of the optically transparent substrate, the light emitting device display chip further having a plurality of external connection pads adjacent outer edges thereof and outside of the central portion of the major surface with the first electrode of each of the light emitting devices being connected to a first plurality of the external connection pads and the second electrode of each of the light emitting devices being connected to a second plurality of the external connection pads;
   a molded base having a first major surface and a second opposed major surface and defining a central opening through the first and second opposed major surfaces substantially coextensive with the complete image generated by the array of light emitting devices, the molded base having a lens formed at the central opening in the second opposed major surface, coextensive with the complete image generated by the array of light emitting devices to receive and magnify the complete image and produce an easily viewable virtual image, the molded base further having a plurality of electrical conductors formed therein, extending from a plurality of connection pads adjacent an edge of the central opening on the first major surface to a plurality of means for electrical connection located about a periphery of the first major surface of the molded base, the major surface of the optically transparent substrate being mounted on the first major surface of the molded base with the first and second pluralities of the external connection pads of the optically transparent substrate being in electrical contact with the plurality of connection pads of the molded base;

a driver substrate having a first major surface and a second opposed major surface and defining a central area in the first major surface substantially coextensive with the complete image at the central portion of the major surface of the optically transparent substrate, the driver substrate further having a plurality of electrical conductors formed therein, each extending from a plurality of connection pads on the first major surface to a plurality of connection pads on the second opposed major surface of the driver substrate, and the first major surface of the driver substrate being mounted on the first major surface of the molded base with the plurality of means for electrical connection of the molded base being in electrical contact with the plurality of connection pads on the first major surface of the driver substrate; and a plurality of driver and controller circuits mounted on the second opposed major surface of the driver substrate and having data input terminals and further having control signal output terminals connected to the first and second electrodes of the light emitting devices through the electrical conductors and the plurality of connection pads of the driver substrate, the plurality of means for electrical connection and the plurality of connection pads of the molded base, and the plurality of connection pads of the optically transparent substrate, for activating the light emitting devices to generate images in accordance with data signals applied to the data input terminals.

15. An integrated electro-optical package as claimed in claim 14 wherein the optically transparent substrate is formed of optically transparent glass.

16. An integrated electro-optical package as claimed in claim 14 wherein the molded base is formed of opaque plastic.

17. An integrated electro-optical package as claimed in claim 14 wherein the plurality of means for electrical connection and the plurality of electrical conductors of the molded base include at least one of a plurality of partially embedded pattern electrical interconnects, a plurality of connection pads, a plurality of mounting pins, a plurality of embedded leadframes, a plurality of surface mounted leadframes and a plurality of plated through-hole vias.

18. An integrated electro-optical package as claimed in claim 14 wherein the lens formed in the molded base is at least one of a diffractive lens and a refractive lens.

19. An integrated electro-optical package as claimed in claim 14 wherein the lens is injection molded into the central opening of the molded base.

20. An integrated electro-optical package as claimed in claim 14 wherein the lens is formed by injection molding an optically transparent substrate into the central opening of the molded base, and thereafter stamping a lens surface on an uppermost major surface of the optically transparent substrate formed within the central opening.

21. An integrated electro-optical package as claimed in claim 14 wherein the array of light emitting devices includes a plurality of organic electroluminescent elements.

22. An integrated electro-optical package as claimed in claim 14 wherein the plurality of electrical conductors formed on the major surface of the optically transparent substrate are positioned to fan out from the array of light emitting devices to the plurality of connection pads formed on the major surface of the optically transparent substrate, the first plurality of external connection pads and the second plurality of external connection pads on the major surface of the optically transparent substrate being positioned in rows and columns on the major surface thereof.

23. An integrated electro-optical package comprising:

an optically transparent substrate having a major surface with a plurality of light emitting devices formed on the major surface, each of the light emitting devices having a first electrode and a second electrode for activating the light emitting devices, the light emitting devices defining a plurality of pixels positioned in rows and columns and cooperating to generate a complete image, when activated, at a central portion of the major surface, the optically transparent substrate further having external connection pads adjacent outer edges thereof and outside of the central portion of the major surface with the first electrode of each of the light emitting devices being connected to a first plurality of the external connection pads defining rows of pixels and the second electrode of each of the light emitting devices being connected to a second plurality of the external connection pads defining columns of pixels;

a molded base having defined therein a central opening and having a first major surface and a second opposed major surface with a first and a second plurality of electrical connections on the first major surface and a plurality of electrical interconnects formed in the molded base between the first and the second plurality of electrical connections, a lens, formed in the second opposed major surface of the molded base, substantially coextensive with the complete image generated by the plurality of light emitting devices, the optically transparent substrate being mounted on the first major surface of the molded base with the first plurality of electrical connections of the molded base in electrical contact with the first plurality of external connection pads and the second plurality of external connection pads on the optically transparent substrate;

a driver substrate having a first major surface and a second opposed major surface with a plurality of connection pads on the first major surface, a plurality of connection pads on the second opposed major surface, and a plurality of electrical interconnects formed in the driver substrate between the pluralities of connection pads, the molded base being mounted on the first major surface of the driver substrate with the plurality of connection pads on the first major surface in electrical contact with the second plurality of electrical connections on the molded base; and a plurality of driver and controller circuits mounted on the second opposed major surface of the driver substrate, having a plurality of data input terminals and further having a plurality of control signal output terminals adapted to be connected to the first and second electrodes of the light emitting devices for activating the light emitting devices to generate a complete image in accordance with a plurality of data signals applied to the plurality of data input terminals.

24. An integrated electro-optical package as claimed in claim 23 wherein the first and second plurality of electrical connection on the first major surface of the molded base include at least one of a plurality of connection pads, a plurality of surface mounted leadframes, a plurality of embedded leadframes and a plurality of plated through-hole vias.

25. An integrated electro-optical package as claimed in claim 23 wherein the plurality of connection pads on the first major surface of the driver substrate include at least one of mounting bumps and mounting pins.

26. An integrated electro-optical package as claimed in claim 23 wherein the plurality of connection pads on the second opposed major surface of the driver substrate include at least one of wire bonding or bump bonding.

27. An integrated electro-optical package as claimed in claim 23 wherein the light emitting devices include organic light emitting devices.

28. An integrated electro-optical package as claimed in claim 23 wherein the optically transparent substrate is formed of optically transparent glass.

29. An integrated electro-optical package as claimed in claim 23 wherein the molded base is formed of opaque plastic.

30. An integrated electro-optical package as claimed in claim 23 wherein the first and second plurality of electrical connections of the molded base, are partially embedded in the molded base.

31. An integrated electro-optical package as claimed in claim 23 wherein the lens formed in the molded base is at least one of a diffractive and a refractive lens.

32. A portable electronic device with visual display comprising:

a portable electronic device having a data output terminal; and a miniature virtual image display having a viewing aperture, the miniature virtual image display being operably attached to a receiver and including an optically transparent substrate having a major surface with a plurality of light emitting devices formed on the major surface, each of the light emitting devices having first and second electrodes for activating the light emitting devices, the light emitting devices defining a plurality of pixels positioned in rows and columns and cooperating to generate a complete image, when activated, at a central portion of the major surface, the optically transparent substrate further having connection pads adjacent outer edges thereof and outside of the central portion of the major surface with the first electrodes of the light emitting devices being connected to a first plurality of the external connection pads defining rows of pixels and the second electrodes of the light emitting devices being connected to a second plurality of the external connection pads defining columns of pixels;

a molded base having a central opening defined therein and having a first major surface and a second opposed major surface with a first and a second means for electrical connection on the first major surface, a plurality of electrical interconnects formed in the molded base between the first and second means for electrical connection, and a lens formed in the second opposed major surface, substantially coextensive with the complete image generated by the plurality of light emitting devices, the optically transparent substrate being mounted on the first major surface of the molded base with the first means for electrical connection in electrical contact with the first and second pluralities of external connection pads on the optically transparent substrate;

a driver substrate having a first major surface and a second opposed major surface with a plurality of connection pads on the first major surface, a plurality of connection pads on the second opposed major surface and a plurality of electrical interconnects formed in the driver substrate between the plurality of connection pads on the first major surface and the plurality of connection pads on the second opposed major surface, the molded base being mounted on the first major surface of the driver substrate with the plurality of connection pads on the first major surface of the driver substrate in electrical contact with the second means for electrical connection of the molded base; and a plurality of driver and controller circuits having a plurality of data input terminals connected to a data output terminal of the electronic device and further having a plurality of control signal output terminals adapted to be connected to the first and second electrodes of the light emitting devices for activating the light emitting devices to generate images in accordance with data signals applied to the plurality of data input terminals, the plurality of driver and controller circuits being mounted on the second opposed major surface of the driver substrate with the plurality of control signal output terminals electrically contacting the plurality of connection pads on the second opposed major surface of the driver substrate.

33. A portable electronic device with visual display as claimed in claim 32 wherein the plurality of light emitting devices on the major surface of the optically transparent substrate include a plurality of organic electroluminescent elements on an optically transparent glass substrate.

34. A portable electronic device with visual display as claimed in claim 32 wherein the molded base is formed of opaque plastic.

35. A portable electronic device with visual display as claimed in claim 32 wherein the first and second means for electrical connection of the molded base include at least one of a plurality of connection pads, a plurality of surface mounted leadframes, a plurality of embedded leadframes, and a plurality of plated through-hole vias.

36. A portable electronic device with visual display as claimed in claim 32 wherein the lens is at least one of a diffractive lens and a refractive lens, designed to magnify the complete image generated by the plurality of light emitting devices and produce a virtual image perceivable by a human eye.

37. A portable electronic device with visual display as claimed in claim 32 wherein the portable electronic device includes portable communications equipment.

38. A portable electronic device with visual display as claimed in claim 37 wherein the portable communications equipment is one of a cellular telephone, a two-way radio and a pager.

* * * * *